United States Patent
Hao et al.

(10) Patent No.: US 10,168,590 B2
(45) Date of Patent: Jan. 1, 2019

(54) DISPLAY SUBSTRATE, DISPLAY PANEL, AND DISPLAY APPARATUS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jingang Hao, Beijing (CN); Dongkun Wu, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 14 days.

(21) Appl. No.: 15/122,892

(22) PCT Filed: Feb. 22, 2016

(86) PCT No.: PCT/CN2016/074266
§ 371 (c)(1),
(2) Date: Aug. 31, 2016

(87) PCT Pub. No.: WO2017/036104
PCT Pub. Date: Mar. 9, 2017

(65) Prior Publication Data
US 2017/0269443 A1    Sep. 21, 2017

(30) Foreign Application Priority Data

Aug. 31, 2015  (CN) .......................... 2015 1 0548887

(51) Int. Cl.
*G02F 1/1362* (2006.01)
*G02F 1/1368* (2006.01)
(Continued)

(52) U.S. Cl.
CPC ...... *G02F 1/136204* (2013.01); *G02F 1/1368* (2013.01); *G02F 1/133345* (2013.01);
(Continued)

(58) Field of Classification Search
USPC .......................................................... 257/72
See application file for complete search history.

(56) References Cited

U.S. PATENT DOCUMENTS 5,929,829 A * 7/1999 Pitt .................. G02F 1/136204
                                                           345/87
7,893,899 B2 * 2/2011 Jeong ................. H01L 27/0248
                                                           345/82

(Continued)

FOREIGN PATENT DOCUMENTS

CN     101226954 A    7/2008
CN     202183003 U    4/2012
(Continued)

OTHER PUBLICATIONS

The World Intellectual Property Organization (WIPO) International Search Report and Written Opinion for PCT/CN2016/074266 dated Jun. 13, 2016 13 Pages.

(Continued)

*Primary Examiner* — Moazzam Hossain
*Assistant Examiner* — Lawrence C Tynes, Jr.
(74) *Attorney, Agent, or Firm* — Anova Law Group, PLLC

(57) ABSTRACT

The present disclosure provides a display substrate, a display panel and a display apparatus. An exemplary display substrate includes a first circuitry element and a second circuitry element in proximity to the first circuitry element, and an electrostatic releasing element, electrically insulated from each of the first and second circuitry elements, and located adjacent to each of the first and second circuitry elements, whereby allowing discharge of electrostatic charges to the electrostatic releasing element from at least one of the first and second circuitry elements, so as to (Continued)

prevent direct electrostatic discharge between the first circuitry element and the second circuitry element.

20 Claims, 3 Drawing Sheets

(51) Int. Cl.
*H01L 27/12* (2006.01)
*G02F 1/1333* (2006.01)
*H01L 27/02* (2006.01)

(52) U.S. Cl.
CPC ...... *H01L 27/0288* (2013.01); *H01L 27/1244* (2013.01); *G02F 2201/503* (2013.01); *G02F 2202/10* (2013.01)

(56) References Cited

U.S. PATENT DOCUMENTS 9,224,760 B2 * 12/2015 Yu .................... H01L 21/768

2005/0108673 A1 * 5/2005 Ota .................... G06F 17/5077
257/773
2008/0174238 A1 * 7/2008 Jeong ................. H01L 27/3276
313/504
2015/0162347 A1 * 6/2015 Yu ..................... H01L 21/768
257/71
2017/0154896 A1 * 6/2017 Li ...................... H01L 27/124

FOREIGN PATENT DOCUMENTS

| | | | |
|---|---|---|---|
| CN | 103941440 A | 7/2014 | |
| CN | 105097800 A | 11/2015 | |
| JP | 2007010994 | * 1/2007 | ........... G02F 1/1345 |
| JP | 2007010994 A | 1/2007 | |
| WO | 2017036104 A1 | 3/2017 | |

OTHER PUBLICATIONS

State Intellectual Property Office of the P.R.C (SIPO) Office Action 1 for 201510548887.2 dated Jul. 28, 2017 15 Pages.

* cited by examiner

DISPLAY SUBSTRATE, DISPLAY PANEL, AND DISPLAY APPARATUS

This application is a national phase entry under 35 U.S.C. § 371 of International Application No. PCT/CN2016/074266, filed on Feb. 22, 2016, which claims priority of Chinese Patent Application No. 201510548887.2, filed on Aug. 31, 2015. The above enumerated patent applications are incorporated by reference herein in their entirety.

FIELD OF THE DISCLOSURE

The present disclosure generally relates to the field of display technologies and, more particularly, relates to a display substrate, a display panel, and a display apparatus.

BACKGROUND

Electro static discharge (ESD) is often undesirable in the fabrication process of thin film transistor liquid crystal display (TFT-LCD). ESD may seriously affect product yield.

When forming a TFT-LCD device, the glass substrate may be in contact with or rub against the machine used for forming layers on the glass substrate. In this case, electrostatic charges may accumulate on surface of the glass substrate. An electrostatic discharge happens when the electrostatic charges have accumulated to a certain level or when the curvature in some locations increases as the glass substrate contacts the machine. The electrostatic discharge breaks the layers formed on the glass substrate. The electrostatic discharge may also cause short circuit between different layers and may thus generate defects. Especially for the wiring area surrounding the display region of the display substrate, more defects are generated due to the electrostatic discharge and the intensive distribution of circuit lines in the wiring area.

In the actual manufacturing process, formation of electrostatic charges may be avoided by adjusting location of contact points with the machine to avoid contacting the charge-sensitive wiring area surrounding the display region or by adding an ion fan in the manufacturing line. However, these methods may not effectively avoid the formation of electrostatic charges.

FIG. 1 illustrates a top view of two circuitry elements which may discharge frequently in a wiring area of a conventional array substrate. As shown in FIG. 1, in a wiring area, a first circuitry element 5 includes a gate metal layer, and a second circuitry element 6 includes gate lines and multiple layers formed thereon. As shown in FIG. 1, a right-angle area 51 of the first circuitry element 5 is adjacent to the second circuitry element 6 having a corresponding area 61. Electrostatic discharge often occurs between the right-angle area 51 and the corresponding area 61.

As shown in FIG. 2, because there is only a single metal layer in the first circuitry element 5, the electrostatic discharge does not affect the circuit lines too much. The second circuitry element 6 includes a multilayer structure formed by multiple semiconductor layers covering the gate lines, which are at the same layer as for the active region of the transistors. When discharging, the electrostatic discharge between the first circuitry element 5 and the second circuitry element 6 easily breaks through an insulating layer between the semiconductor layer and the gate lines and causes short circuit to affect driving of the display substrate.

Conventional methods to solve the discharging problem between the first circuitry element 5 and the second circuitry element 6 include using a rounded angle to replace the right angle in the first circuitry element 5 and the second circuitry element 6. Another method to solve the discharging problem includes increasing the distance between the first circuitry element 5 and the second circuitry element 6 in the wiring area. However, these methods may not be equally effective on different types of display substrates and may not indeed solve the problems of display substrates due to the electrostatic discharge.

The disclosed display substrate, display panel, and display apparatus are directed to at least partially alleviate one or more problems set forth above and to solve other problems in the art.

BRIEF SUMMARY OF THE DISCLOSURE

One aspect of the present disclosure provides a display substrate. The display substrate includes a first circuitry element and a second circuitry element in proximity to the first circuitry element, and an electrostatic releasing element, electrically insulated from each of the first and second circuitry elements, and located adjacent to each of the first and second circuitry elements, whereby allowing discharge of electrostatic charges to the electrostatic releasing element from at least one of the first and second circuitry elements, so as to prevent direct electrostatic discharge between the first circuitry element and the second circuitry element.

Optionally, the electrostatic releasing element is located in closer proximity to the first circuitry element.

Optionally, the electrostatic releasing element spatially separates the first and second circuitry elements.

Optionally, the first circuitry element includes a first electrostatic discharging part capable of releasing own electrostatic charges, the second circuitry element includes a second electrostatic discharging part capable of releasing own electrostatic charges, and the electrostatic releasing element includes an electrostatic releasing part capable of receiving electrostatic charges.

Optionally, each of a first distance between the first electrostatic discharging part and the electrostatic releasing part and a second distance between the second electrostatic discharging part and the electrostatic releasing part is less than a distance between the first electrostatic discharging part and the second electrostatic discharging part.

Optionally, the electrostatic releasing element is in a peripheral of the first and second circuitry elements.

Optionally, one or more of the first electrostatic discharging part and the second electrostatic discharging part include a point discharge structure, and the electrostatic releasing part includes a point releasing structure, corresponding to the point discharge structure.

Optionally, one or more of the first electrostatic discharging part and the second electrostatic discharging part are free of a point discharge structure, and the electrostatic releasing part includes a point releasing structure.

Optionally, the point releasing structure includes a plurality of spiked edges with tip angles of less than 90 degree.

Optionally, the point releasing structure is zigzag-shaped having acute angles at zigzag turns.

Optionally, the point discharge structure of at least one of the first electrostatic discharging part and the second electrostatic discharging part includes a tip angle of 90 degree.

Optionally, the point discharge structure of at least one of the first electrostatic discharging part and the second electrostatic discharging part includes spiked edges or a zigzag turns.

Optionally, the electrostatic releasing element is made of a semiconductor material.

Optionally, the first circuitry element includes a first conductive layer on a substrate. The second circuitry element includes a second conductive layer on the substrate, an insulating layer on the second conductive layer, and a semiconductor layer on the insulating layer. The first conductive layer and the second conductive layer are made of a same material. The electrostatic releasing element and the semiconductor layer are made of a same material.

Optionally, the first and second circuitry elements and the electrostatic releasing element are configured on a wiring area of the display substrate.

Optionally, the wiring area is in a peripheral of a display region, and the display region includes a plurality of transistors.

Optionally, the semiconductor layer of the second circuitry element in the wiring area and an active region of each transistor in the display region are made of a same material.

Another aspect of the present disclosure provides a display panel including the disclosed display substrate.

Another aspect of the present disclosure provides a display apparatus including the disclosed display panel.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. It should be understood that the exemplary embodiments described herein are only intended to illustrate and explain the present invention and not to limit the invention.

The present disclosure provides a display substrate, a display panel, and a display apparatus according to various disclosed embodiments of the present disclosure. An exemplary display substrate may include a first circuitry element and a second circuitry element in proximity to the first circuitry element, and an electrostatic releasing element, electrically insulated from each of the first and second circuitry elements, and located adjacent to each of the first and second circuitry elements, whereby allowing discharge of electrostatic charges to the electrostatic releasing element from at least one of the first and second circuitry elements, so as to prevent direct electrostatic discharge between the first circuitry element and the second circuitry element.

Embodiment 1

Figure 1:
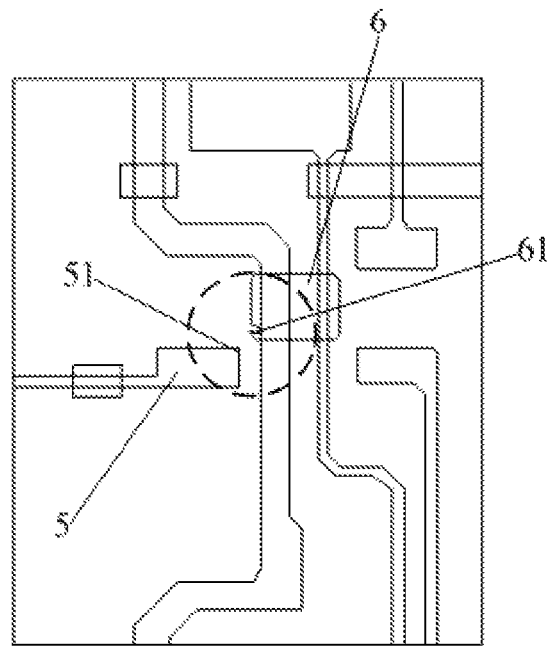
FIG. 1 illustrates a top view of two circuitry elements which may discharge frequently in a wiring area of a conventional array substrate.
Figure 2:
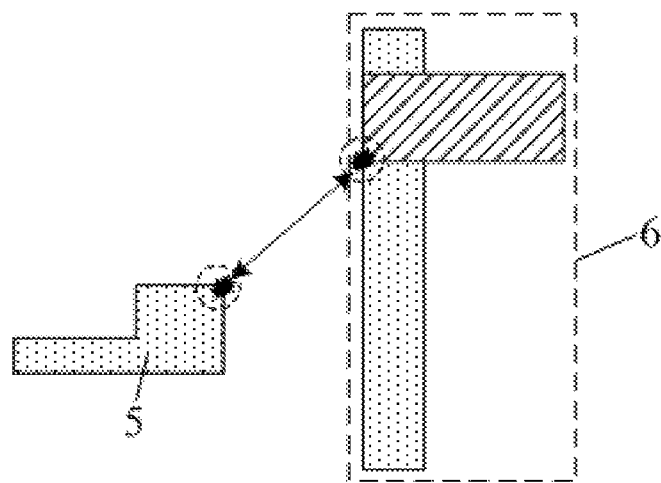
FIG. 2 illustrates electrostatic discharge between the two circuitry elements in FIG. 1.
Figure 3:
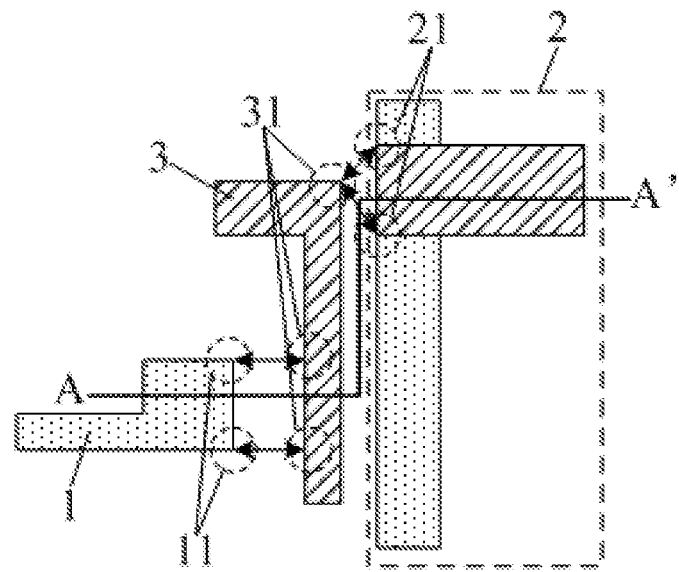
FIG. 3 illustrates a top view of an exemplary display substrate including circuitry elements in a wiring area of the display substrate according to various disclosed embodiments of the present disclosure.

The present embodiment provides a display substrate, which may include a wiring area in the peripheral of a display region as shown in FIG. 3. A first circuitry element 1 and a second circuitry element 2 may be arranged adjacent to each other and electrically insulated from each other in the wiring area.

The wiring area may further include an electrostatic releasing element 3, for example, placed between the first and second circuitry elements 1 and 2, or to spatially separate the first and second circuitry elements. In one embodiment, the electrostatic releasing element 3 may be located in closer proximity to the first circuitry element 1. In another embodiment, the electrostatic releasing element 3 may be located in closer proximity to the second circuitry element 2. In another embodiment, the electrostatic releasing element 3 may be distanced substantially-equally from each of the first and second circuitry elements.

The electrostatic releasing element 3 may be electrically insulated from each of the first circuitry element 1 and the second circuitry element 2. The electrostatic discharge between the first circuitry element 1 and the second circuitry element 2 may first be released to the electrostatic releasing element 3.

As disclosed herein, the first circuitry element 1 and the second circuitry element 2 may be any two adjacent discharging sources paired that electrostatic discharge may easily occur in the display substrate. The electrostatic releasing element 3 may be configured to allow the electrostatic charges accumulated on the first circuitry element 1 and the second circuitry element 2 to be released first to the electrostatic releasing element 3. When discharging, the electrostatic releasing element 3 may first be broken through to thus protect the first circuitry element 1 and the second circuitry element 2 from being damaged by the discharging. Therefore, the signal lines or circuit lines in the wiring area may be protected and may not be damaged.

The electrostatic releasing element 3 may be arranged in the wiring area. The electrostatic releasing element 3 may be configured to allow the electrostatic discharge between the first circuitry element 1 and the second circuitry element 2 to be released first to the electrostatic releasing element 3. As such, electrostatic discharge occurring between the first circuitry element 1 and the second circuitry element 2 may be avoided. Damages to the first and second circuitry elements due to electrostatic discharge may also be eliminated. The electrostatic releasing element 3 may further facilitate to protect the display substrate. Defects generated in the display substrate due to the electrostatic discharge may also be avoided and the quality of the display substrate may be improved.

In various embodiments, the first circuitry element 1 may be configured to have a first electrostatic discharging part 11 to release own electrostatic charges. The second circuitry element 2 may be configured to have a second electrostatic discharging part 21 to release own electrostatic charges. The electrostatic releasing element 3 may have an electrostatic releasing part 31 configured to receive electrostatic charges from the first electrostatic discharging part 11 and the second electrostatic discharging part 21.

In various embodiments, a first distance between the first electrostatic discharging part 11 and the electrostatic releasing part 31 and a second distance between the second electrostatic discharging part 21 and the electrostatic releasing part 31 may be less than a distance between the first electrostatic discharging part 11 and the second electrostatic discharging part 21.

In embodiments, electrostatic charges from an circuitry element may be released to a most nearby circuitry element. The disclosed configuration shown in FIG. 3 may allow electrostatic charges accumulated on each of the first circuitry element 1 and the second circuitry element 2 to be released first to the electrostatic releasing element 3 to thus protect the first circuitry element 1 and the second circuitry element 2 from being damaged by the electrostatic discharge. Quality of the resultant display substrate may be improved.

In one embodiment, the electrostatic releasing element 3 may be located between the first circuitry element 1 and the second circuitry element 2. Based on this arrangement, the first distance between the electrostatic releasing element 3 and the first circuitry element 1 and the second distance between the electrostatic releasing element 3 and the second circuitry element 2 may be less than the distance between the first circuitry element 1 and the second circuitry element 2. The first circuitry element 1 and the second circuitry element 2 may then release the electrostatic charges to the most nearby element, such as the electrostatic releasing element 3. The electrostatic discharge between the first circuitry element 1 and the second circuitry element 2, and damages generated to the first and second circuitry elements land 2 may be avoided. Damages to the signal lines in the wiring area due to the electrostatic discharge may thus be eliminated.

Figure 4:
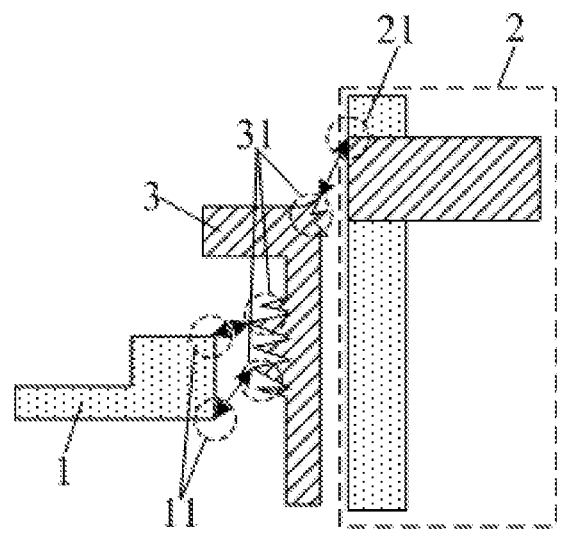
FIG. 4 illustrates a top view of a point discharge structure of the circuitry element in FIG. 3 according to various disclosed embodiments of the present disclosure.

In one embodiment, as shown in FIG. 4, the first electrostatic discharging part 11 and the second electrostatic discharging part 21 may include a point discharge structure. The electrostatic releasing part 31 may include a point releasing structure.

For example, the point releasing structure of the electrostatic releasing part 31 may have a plurality of spiked edges with tip angles of less than 90 degree. In another example, the point releasing structure may be zigzag-shaped having acute angles at zigzag turns.

In embodiments, the point discharge structure of at least one of the first electrostatic discharging part and the second electrostatic discharging part includes spiked edges or zigzag turns.

In one embodiment, the tip angles of the first electrostatic discharging part 11 and the second electrostatic discharging part 21 may be about 90 degree. The tip angle of the electrostatic releasing part 31 may be less than about 90 degree. The point releasing structure of the electrostatic releasing part 31 may accelerate the releasing of the electrostatic charges from the first electrostatic discharging part 11 and the second electrostatic discharging part 21. The point releasing structure of the electrostatic releasing part 31 may also accelerate the receiving of the electrostatic charges. Then electrostatic charges may thus be rapidly released. Therefore, the point releasing structure may be configured to protect the first circuitry element 1 and the second circuitry element 2 from being damaged.

Note that, in some embodiments, the first electrostatic discharging part 11 and the second electrostatic discharging part 21 may not have a point discharging structure. In this case, the electrostatic discharging process may be slower via the electrostatic releasing element 3. However, the electrostatic charges accumulated on the first circuitry element 1 and the second circuitry element 2 may still be released through the electrostatic releasing element 3.

In embodiments, the electrostatic releasing element 3 may be made of semiconductor materials. The semiconductor materials may be amorphous silicon, polysilicon, or the like. The semiconductor material may have a better charge-carrying ability than a metal material. The semiconductor material may have a better receiving ability for the electrostatic discharge. The semiconductor material may receive and carry more electrostatic discharges.

Figure 5:
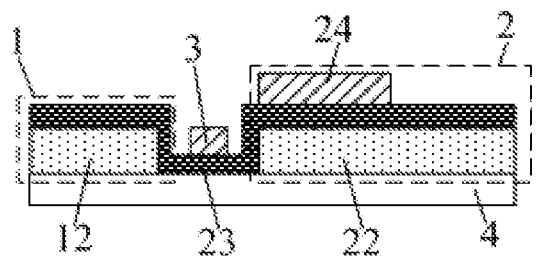
FIG. 5 illustrates a cross-sectional view of the circuitry element in FIG. 3 along A-A' direction according to various disclosed embodiments of the present disclosure.

FIG. 5 illustrates a cross-sectional view of the circuitry element in FIG. 3 along A-A' direction according to various disclosed embodiments of the present disclosure.

As shown in FIG. 5, the first circuitry element 1 may include a first conductive layer 12 on a substrate 4. The second circuitry element 2 may include a second conductive layer 22, an insulating layer 23, and a semiconductor layer 24 sequentially formed on the substrate 4. The first conductive layer 12 and the second conductive layer 22 may be made of a same material and may be arranged in a same layer. For example, the first conductive layer 12 and the second conductive layer 22 may be formed simultaneously in a single, same process using the same material.

The first conductive layer 12 and the second conductive layer 22 may use the same material as used for the gate electrode of transistors, used as switches in the display region, and may be formed along with the formation of the gate electrode in a single patterning process.

The semiconductor layer 24 may be made of a same material as for active region of the transistors in the display region and may be arranged in a same layer. For example, the semiconductor layer 24 and the active region may be formed simultaneously in a single, same process using the same material.

The electrostatic releasing element 3 and the semiconductor layer 24 may be made of a same material and may be arranged in the same layer. For example, the electrostatic releasing element 3, the semiconductor layer 24, and the active region of the transistors in the display region may be formed simultaneously in a single, same patterning process using a same material and may be arranged in the same layer.

As such, the electrostatic releasing element 3 may be incorporated into the display substrate without the need for extra process step(s) during fabrication of the display substrate and without scarifying production yield of the display substrate.

It should be noted that, the structures of the first circuitry element 1 and the second circuitry element 2 shown in FIGS. 3-5 are for illustration purposes and the present disclosure may not be limited to such structures. Any suitable structures may be used for the electrostatic discharging structures formed in the wiring area in an array substrate. In exemplary array substrates, each of the first circuitry element 1 and the second circuitry element 2 may include other possible structures including, for example, a multi-layer structure and/or a single-layer structure. In addition, the electrostatic releasing element 3 may be made of a metal conductive material.

Electro static discharge (ESD) often occurs when multiple layers are configured in close proximity, especially in the wiring area surrounding the display region. When ESD occurs, corresponding insulation layer may be broken through, which causes a short circuit. The disclosed releasing element 3 may allow discharge of electrostatic charges to the electrostatic releasing element 3 from one or both of the first circuitry element 1 and the second circuitry element 2, so as to prevent direct electrostatic discharge between the first circuitry element 1 and the second circuitry element 2. In one embodiment, the electrostatic releasing element 3 may have a dimension or an area that is sufficiently large to provide desired releasing effect.

Embodiment 2

Figure 6:
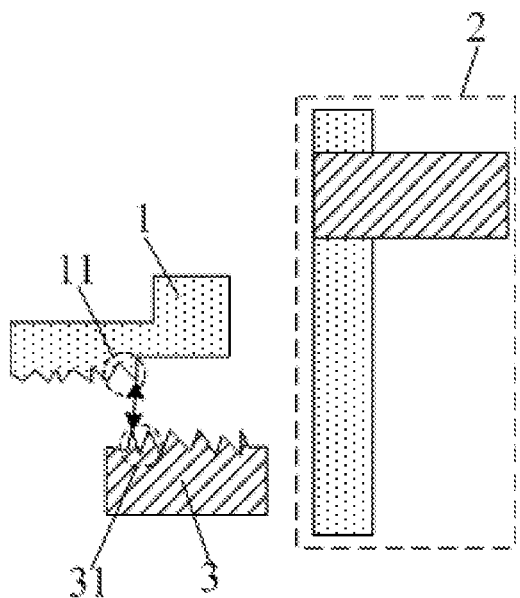
FIG. 6 illustrates a top view of another exemplary display substrate including circuitry elements in a wiring area of the display substrate according to various disclosed embodiments of the present disclosure.

The present embodiment provides another exemplary display substrate, as shown in FIG. 6. Compared with the exemplary display substrate in FIGS. 3-5, the display substrate in FIG. 6 may include a different arrangement of the electrostatic releasing element 3. In this example, the electrostatic releasing element 3 may be located in the peripheral of the first circuitry element 1 and the second circuitry element 2.

In various embodiments, the first circuitry element 1, the second circuitry element 2, and the electrostatic releasing element 3 in FIGS. 3-6 may be the same or similar with each other, but sometimes may be different.

As long as the first distance between the first electrostatic discharging part 11 and the electrostatic releasing part 31 and the second distance between the second electrostatic discharging part 21 and the electrostatic releasing part 31 are less than the distance between the first electrostatic discharging part 11 and the second electrostatic discharging part 21, electrostatic charges accumulated on each of the first and second circuitry elements 1 and 2 may be released first to the electrostatic releasing element 3 to thus protect the first and second circuitry elements 1 and 2 from being damaged by the electrostatic discharge. Quality of the resultant display substrate may be improved.

In this manner, by configuring an electrostatic releasing element in a wiring area of a display substrate, electrostatic discharge between the first and second circuitry elements may be released first to the electrostatic releasing element, instead of the first and second circuitry elements. Damages to the first and second circuitry elements due to the electrostatic discharge there-between may be avoided. Defects generated due to the electrostatic discharge in the display substrate may also be avoided. Quality of the resultant display substrate may be improved.

Embodiment 3

Various embodiments may also provide a display panel. The display panel may include the disclosed display substrate.

By incorporating the disclosed display substrate, the display panel may not have split screen or full-screen horizontal stripes generated due to the electrostatic discharge between internal circuitry elements in the display substrate. Therefore, the quality of the display panel may be improved.

Embodiment 4

Various embodiments may further provide a display apparatus. The display apparatus may include the disclosed display panel.

The display apparatus may include, for example, a liquid crystal panel, an electronics paper, and OLED panel, a cell phone, a tablet, a television, a monitor, a laptop, a digital frame, a navigation, or any product or part with a display function.

By incorporating the disclosed display substrate, the display apparatus may not have split screen or full-screen horizontal stripes generated due to the electrostatic discharge between internal circuitry elements in the display substrate. Therefore, the quality of the display apparatus may be improved.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A display substrate, comprising:
a first circuitry element and a second circuitry element in proximity to the first circuitry element, the first circuitry element including a first conductive layer, the second circuitry element including a second conductive layer, and the first conductive layer and the second conductive layer being electrically insulated by an insulating layer; and
an electrostatic releasing element on the insulating layer, including an electrostatic releasing part capable of receiving electrostatic charges, electrically insulated from each of the first and second circuitry elements by the insulating layer, and located adjacent to each of the first and second circuitry elements,
whereby allowing discharge of electrostatic charges to the electrostatic releasing element from at least one of the first and second circuitry elements, so as to prevent direct electrostatic discharge between the first circuitry element and the second circuitry element.

2. The display substrate according to claim 1, wherein:
the electrostatic releasing element is located in closer proximity to the first circuitry element.

3. The display substrate according to claim 1, wherein:
the electrostatic releasing element spatially separates the first and second circuitry elements.

4. The display substrate according to claim 1, wherein:
the first circuitry element includes a first electrostatic discharging part capable of releasing own electrostatic charges, and
the second circuitry element includes a second electrostatic discharging part capable of releasing own electrostatic charges.

5. The display substrate according to claim 4, wherein:
each of a first distance between the first electrostatic discharging part and the electrostatic releasing part and a second distance between the second electrostatic discharging part and the electrostatic releasing part is less than a distance between the first electrostatic discharging part and the second electrostatic discharging part.

6. The display substrate according to claim 4, wherein:
one or more of the first electrostatic discharging part and the second electrostatic discharging part include a point discharge structure, and
the electrostatic releasing part includes a point releasing structure, corresponding to the point discharge structure.

7. The display substrate according to claim 6, wherein:
the point releasing structure includes a plurality of spiked edges with tip angles of less than 90 degree.

8. The display substrate according to claim 6, wherein:
the point releasing structure is zigzag-shaped having acute angles at zigzag turns.

9. The display substrate according to claim 6, wherein:
the point discharge structure of at least one of the first electrostatic discharging part and the second electrostatic discharging part includes a tip angle of 90 degree.

10. The display substrate according to claim 6, wherein:
the point discharge structure of at least one of the first electrostatic discharging part and the second electrostatic discharging part includes spiked edges or zigzag turns.

11. The display substrate according to claim 4, wherein:
one or more of the first electrostatic discharging part and the second electrostatic discharging part are free of a point discharge structure, and
the electrostatic releasing part includes a point releasing structure.

12. The display substrate according to claim 1, wherein:
the electrostatic releasing element is in a peripheral of the first and second circuitry elements.

13. The display substrate according to claim 1, wherein:
the electrostatic releasing element is made of a semiconductor material.

14. The display substrate according to claim 1, wherein:
the first circuitry element includes the first conductive layer on a substrate,
the second circuitry element includes the second conductive layer on the substrate, the insulating layer on the second conductive layer, and a semiconductor layer on the insulating layer,
the first conductive layer and the second conductive layer are made of a same material, and
the electrostatic releasing element and the semiconductor layer are made of a same material.

15. The display substrate according to claim 1, wherein:
the first and second circuitry elements and the electrostatic releasing element are configured on a wiring area of the display substrate.

16. The display substrate according to claim 15, wherein:
the wiring area is in a peripheral of a display region, and
the display region includes a plurality of transistors.

17. The display substrate according to claim 16, wherein:
the semiconductor layer of the second circuitry element in the wiring area and an active region of each transistor in the display region are made of a same material.

18. A display apparatus, comprising:
a display panel including the display substrate according to claim 17.

19. A display substrate, comprising:
a first circuitry element and a second circuitry element in proximity to the first circuitry element, the first circuitry element including a first conductive layer, the second circuitry element including a second conductive layer, and the first conductive layer and the second conductive layer being electrically insulated by an insulating layer; and
an electrostatic releasing element made of a semiconductor material and arranged on the insulating layer, electrically insulated from each of the first and second circuitry elements by the insulating layer, and located adjacent to each of the first and second circuitry elements,
whereby allowing discharge of electrostatic charges to the electrostatic releasing element from at least one of the first and second circuitry elements, so as to prevent direct electrostatic discharge between the first circuitry element and the second circuitry element.

20. A display substrate, comprising:
a first circuitry element and a second circuitry element in proximity to the first circuitry element; and
an electrostatic releasing element including an electrostatic releasing part capable of receiving electrostatic charges, electrically insulated from each of the first and second circuitry elements, and located adjacent to each of the first and second circuitry elements,
whereby allowing discharge of electrostatic charges generated by the first circuitry element and the second circuitry element to direct to the electrostatic releasing element, so as to prevent direct electrostatic discharge due to a different potential between the first circuitry element and the second circuitry element.

* * * * *